United States Patent [19]

Plourde

[11] Patent Number: 5,894,490
[45] Date of Patent: Apr. 13, 1999

[54] INCREASING THE IMPEDANCE OF SOLID STATE LIGHT SOURCE SUBSYSTEMS

[75] Inventor: James Kevin Plourde, Allentown, Pa.

[73] Assignee: Lucent Technologies Inc., Murray Hill, N.J.

[21] Appl. No.: 08/882,636

[22] Filed: Jun. 25, 1997

[51] Int. Cl.$^6$ .............................. H01S 3/10; H04B 10/04
[52] U.S. Cl. ............................... 372/38; 359/187
[58] Field of Search ............................... 372/38; 359/187

[56] References Cited

U.S. PATENT DOCUMENTS

| | | | |
|---|---|---|---|
| 4,369,525 | 1/1983 | Breton et al. | 455/618 |
| 4,625,105 | 11/1986 | Hentschel et al. | 250/205 |
| 5,444,564 | 8/1995 | Newberg | 359/187 |
| 5,471,492 | 11/1995 | Pidgeon, Jr. et al. | 372/38 |
| 5,477,367 | 12/1995 | Van Der Heijden | 372/38 |

OTHER PUBLICATIONS

Millman et al., *Integrated Electronics: Analog and Digital Circuits and Systems*, Ch. 13, pp. 408–445 (1972) (No month).

*Primary Examiner*—James W. Davie

[57] ABSTRACT

The input impedance of a laser subsystem is matched to the output impedance of its driver by means of a current/series or voltage/series-connected negative feedback loop which generates an electronic feedback signal from the laser output. A combiner combines the feedback signal and the drive signal and applies a difference signal to the laser. In another embodiment, a transformer is disposed between the driver and the combiner to decrease the apparent output impedance of the driver, thereby facilitating the impedance matching function of the feedback loop.

17 Claims, 3 Drawing Sheets

INCREASING THE IMPEDANCE OF SOLID STATE LIGHT SOURCE SUBSYSTEMS

FIELD OF THE INVENTION

This invention relates generally to increasing the impedance of solid state light source subsystems and, more particularly, to impedance-matching semiconductor laser subsystems to their driver circuits.

BACKGROUND OF THE INVENTION

In general, solid state light sources (e.g., semiconductor laser or LED modules) are known to have an impedance which is different from that of the driver circuits (hereinafter drivers) to which they are electronically coupled. This impedance mismatch means that some of the power delivered by the driver is wasted. In many systems applications, such as analog systems for wireless communications, the power budget does not tolerate wasting any significant amount of power. For example, semiconductor laser modules for use in wireless PCS or cellular systems typically have an impedance of about 7 $\Omega$, whereas their drivers typically have a much higher impedance in the range of about 25–75 $\Omega$. Furthermore, specifications are often placed on the RF input impedance of a laser module, either in terms of the impedance itself or in terms of the return loss associated with the characteristic impedance of measurement systems used to test the module. Required RF impedance levels are also typically in the range of about 25–75 $\Omega$.

In the prior art, this problem is sometimes addressed by adding a resistor in series with the laser. Although this approach is simple, low cost and broadband, most of the driver power is dissipated in the series matching resistor, rather than being used for its intended function—to generate higher optical output power from the laser. Wasting power in this fashion is of concern in any system where efficiency is important, especially in wide bandwidth applications. Another prior art design uses an electrical transformer between the laser and the driver. Although this approach is also simple and low cost, it may suffer disadvantages associated with the limited bandwidth and lack of parasitic control in the transformer.

Thus, there is a need remaining in the art for an impedance matching scheme which addresses these shortcomings.

SUMMARY OF THE INVENTION

In accordance with one aspect of my invention, an electro-optical subsystem comprises a solid state light source and a negative feedback circuit coupled between the electrical input and optical output of the source. The source and the feedback circuit are coupled in a series configuration with respect to the driver output, thereby increasing the input impedance of the subsystem. In one embodiment the feedback circuit is designed so that the input impedance of the subsystem is essentially matched to that of the driver. In another embodiment, the input impedance of the subsystem is increased by the combination of a similar series-connected negative feedback circuit and a suitable transformer disposed between the driver and the source.

BRIEF DESCRIPTION OF THE DRAWINGS

My invention, together with its various features and advantages, can be readily understood from the following more detailed description taken in conjunction with the accompanying drawing, in which.

In the figures solid lines interconnecting elements denote electrical paths or signals, whereas dashed lines and irregular arrows denote optical paths or signals. In addition, in FIGS. 1,6 and 7 the capacitors serve to block DC and pass RF signals, as is well known in the art. In the interests of simplicity and brevity, they will not be otherwise addressed in the description which follows.

DETAILED DESCRIPTION OF THE INVENTION

Figure 1:
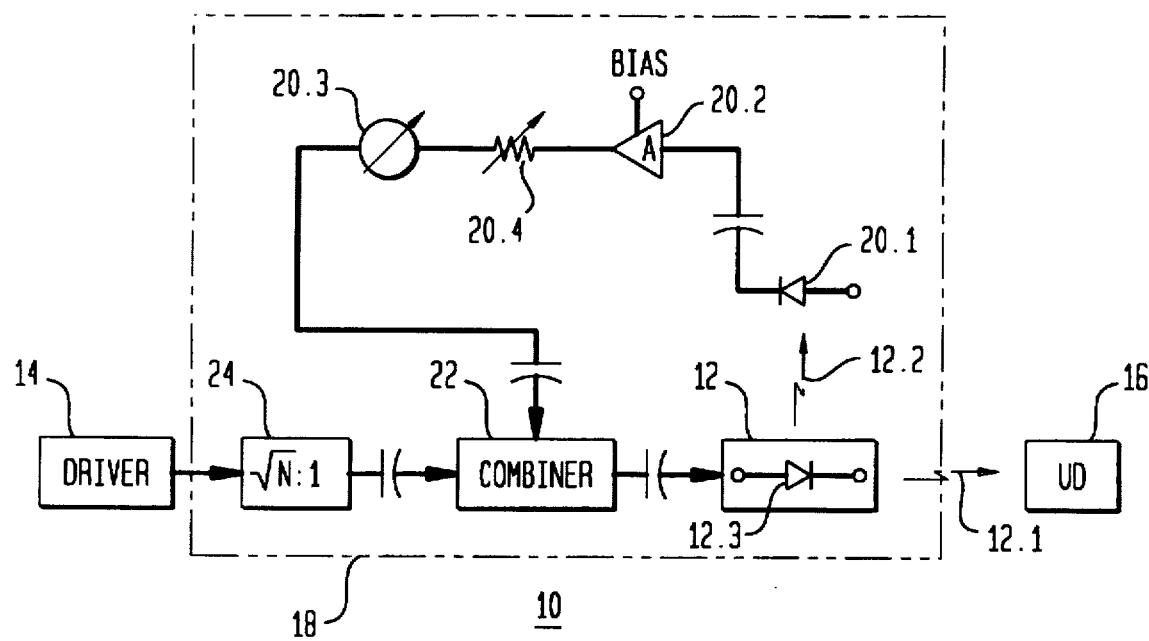
FIG. 1 is a block diagram of a laser transmitter including an electro-optical subsystem in accordance with one embodiment of my invention.

Although my invention is applicable to solid state light source subsystems in general, especially subsystems for semiconductor lasers and/or LEDs, in the interests of simplicity the following discussion will be directed to semiconductor laser subsystems. With reference now to FIG. 1, a laser transmitter 10 comprises an electro-optical subsystem 18 which is electrically coupled to a driver 14 and optically coupled to a utilization device 16. The driver 14 illustratively delivers RF power to a semiconductor laser diode 12.3 disposed in a laser module 12. The laser in turn generates a primary optical output 12.1 coupled to utilization device 16. The utilization device 16 may include, for example, an optical fiber, a photodiode, an optical amplifier, a piece of terminal equipment such as a receiver, or a combination of these.

In accordance with one aspect of my invention, the input impedance of the laser subsystem 18 is increased (as compared with that of the laser module 12 alone) by coupling a signal portion 12.2 of the optical output to the laser input via a negative feedback loop 20 and a combiner 22. Provided that the negative feedback loop and the laser module are connected in a current/series or voltage/series configuration with respect to the driver output (i.e., at the input terminal pair where the RF input and feedback signals are combined), the impedance is increased by an amount proportional to the product of the transmission factor $\beta$ of the feedback loop 20 and the electrical gain $G_m$ of the laser module 12. While the latter is primarily a function of the design of the laser, the former can be predetermined by controlling the operating parameters of various elements in the feedback loop 20. Illustratively, the feedback loop 20 includes a photodiode 20.1 for receiving the optical signal portion 12.2, an amplifier 20.2 for amplifying the photocurrent from the photodiode 20.1, and an optional gain adjust element 20.4 and/or an optional phase adjust element 20.3 connected in series with one another between the output of amplifier 20.2 and one input of combiner 22. Elements 20.3 and 20.4 are use to adjust the amplitude and phase of the feedback signal. The amplitude adjust element 20.4, along with other circuit elements that contribute to the feedback signal amplitude, sets the subsystem input impedance to the desired level. However, if the gain of the amplifier is itself adjustable, the element 20.4 may not be necessary. On the other hand, the element 20.3 sets the phase of the feedback signal to the value required to achieve negative feedback. The effect of the combiner 22 is included in $\beta$ and $G_m$ in a consistent manner.

The other input of combiner 22 is coupled to the output of driver 14, either directly or through an optional $N^{1/2}:1$ transformer 24. The purpose of the transformer is to provide an additional impedance increment beyond that provided by the feedback loop, if necessary or desirable.(Viewed from another perspective, the transformer 24 reduces the apparent output impedance of the driver, thus facilitating impedance matching by means of the feedback loop 20. Whether or not the use of a transformer is suitable in such applications will often depend on the bandwidth and parasitic level of the transformer, which in turn depend on the number of turns in the primary and secondary (as does the impedance ratio of the transformer). In general, fewer turns implies higher frequency response.

Several examples will be instructive. Suppose the laser input impedance is 5 Ω and the driver output impedance is 25 Ω. Then $(1+\beta G_m)=25/5=5$, a 14 dB effect which is realizable under many operating conditions. However, suppose instead that the output impedance of the driver is 50 Ω. Then $(1+\beta G_m)=50/5=10$, a 20 dB effect. In some applications, it may not be practical for the feedback loop alone to provide the entire increase in impedance. If, for example, the operating frequency limits the performance of the feedback loop, then it may be desirable to use the feedback loop in combination with the transformer 24; i.e., the feedback loop is used to increase the impedance to some intermediate value (e.g., $(1+\beta G_m)=25/5=5$, a 14 dB effect, as described above), and the transformer 24 with N=2 is used to provide the additional factor of 2 impedance increase. This type of arrangement should be practical at frequencies up to about 1 GHz. In addition, the arrangement provides improved linearity of 14 dB, an important feature particularly in analog systems. On the other hand, suppose the driver output impedance is 75 Ω. Then, the driver can be impedance matched to the laser subsystem by a transformer 24 with N=4 in combination with a current/series feedback loop providing $(1+\beta G_m)=18.75/5=3.75$, about an 11.5 dB effect. As before, the linearity would be improved by about the same amount (11.5 dB).

Figure 2:
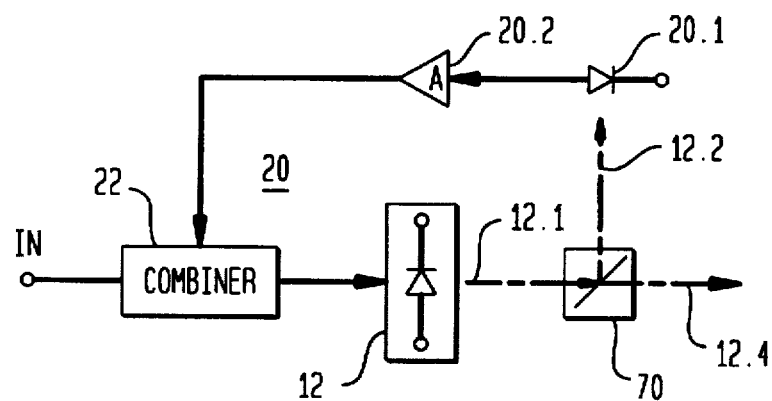
FIGS. 2–5 are block diagrams of alternative designs for coupling the laser output to the feedback loop in accordance with illustrative embodiments of my invention.
Figure 3:
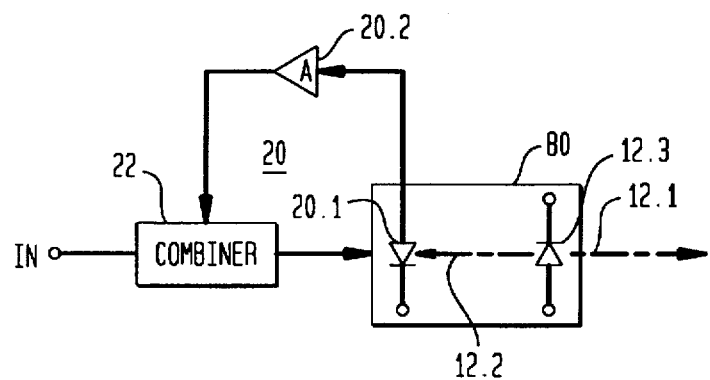
Figure 4:
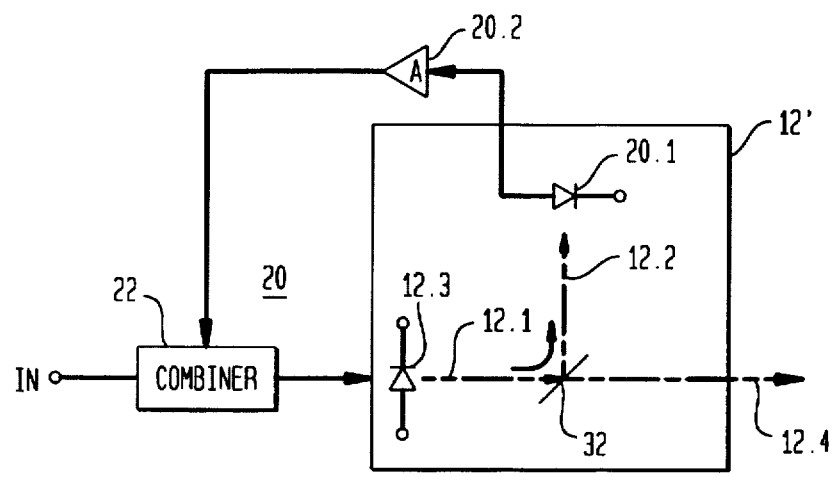
Figure 5:
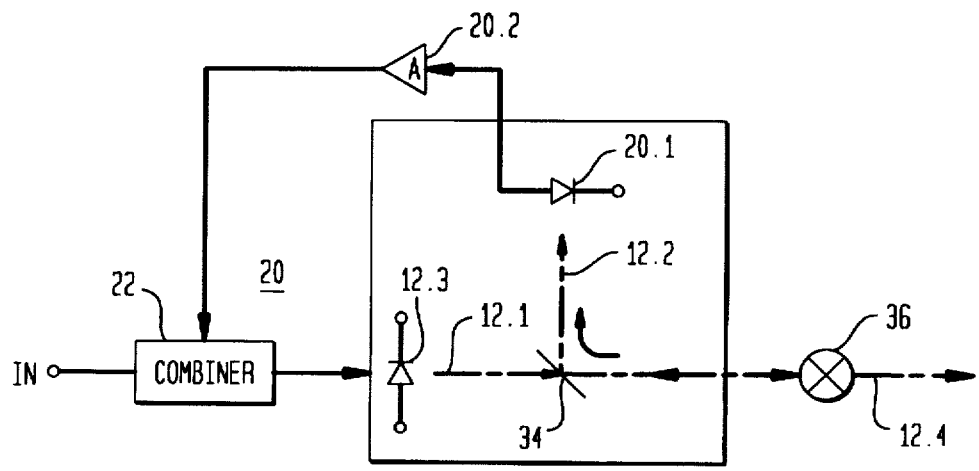

The optical feedback signal (i.e., the signal portion 12.2 of the laser output 12.1) can be generated in a number of ways, as shown in FIGS. 2–5 (where the terminal IN is coupled to the output of the driver or optional transformer, if used). Thus, as shown in FIG. 2, a coupler or splitter 70 splits the laser output 12.1 into the feedback signal portion 12.2 and a transmitted signal portion 12.4. In this case, both the coupler 70 and the photodiode 20.1 are located external to the laser module 12. In contrast, in FIG. 3 the photodiode 20.1 is internal to the laser module 12 and is located as a backface monitor of laser diode 12.3; i.e., the backface emission generates the feedback signal portion 12.2 which is detected by the photodiode 20.1; no coupler is required. Alternatively, the laser, coupler/splitter and photodiode may all be located internal to the laser module, as in the case of the bidirectional (BIDI) modules 12' shown in FIGS. 4 and 5. These modules are bidirectional in that they can be used in applications where optical signals propagate in opposite directions along the same path between the module and a utilization device. In FIG. 4, the laser output signal 12.1 is split by splitter 32 into the feedback signal portion 12.2 which is received by photodiode 20.1 and a transmitted signal portion 12.4 which is received by a utilization device (not shown). In contrast, in FIG. 5 the laser output signal 12.1 is transmitted through the splitter to a utilization device (not shown). However, a portion of the transmitted signal is reflected by partially reflective element 36. The reflected signal propagates in the opposite direction back into the module where the splitter 36 reflects it, as the feedback signal 12.2, to photodiode 20.1. Although element 36 is depicted as being external to module 12, but it could also be located internal to the module. Of course, the BIDI of FIG. 5 would not be used in a bidirectional application due to the presence of element 36.

Figure 6:
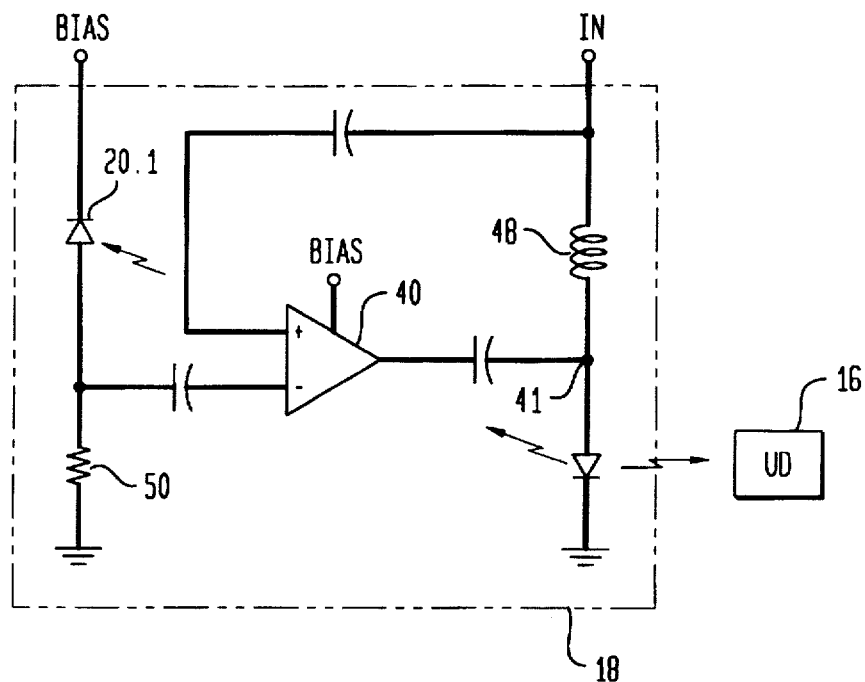
FIG. 6 is a circuit schematic illustrating one embodiment of my invention in which a differential amplifier serves as both the combiner and feedback amplifier.
Figure 7:
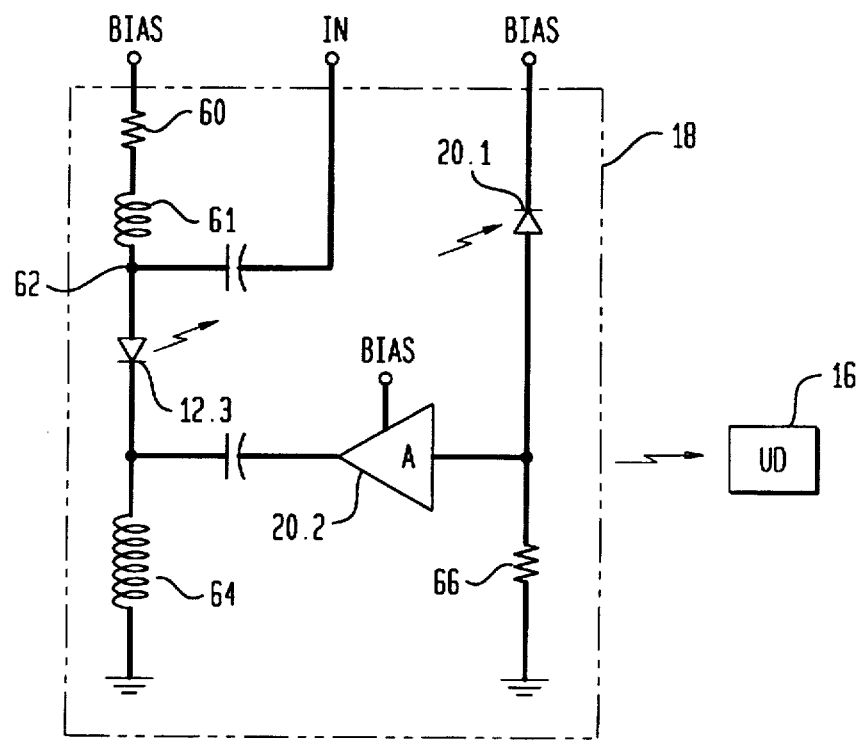
FIG. 7 is a circuit schematic illustrating another embodiment of my invention in which the combiner comprises a pair of circuit nodes.

As with the various coupling schemes, the combiner 22 may take on several forms. In FIG. 6, for example, a differential amplifier 40 serves the dual functions of combiner and amplifier (i.e.; the functions of combiner 22 and amplifier 20.2 of FIG. 1). More specifically, the RF input at terminal IN is coupled to the positive input of amplifier 40, and the feedback signal from photodiode 20.1 is coupled to its negative input. The RF output of amplifier 40 is coupled to the laser diode 12.3 through node 41, which is isolated from the RF input by inductor 48. Alternatively, the combiner 22 of FIG. 7 comprises a pair of circuit nodes 62 and 65 between which laser diode 12.3 is coupled. The RF input signal IN is coupled to node 62 (the anode side of diode laser 12.3), and the feedback signal from photodiode 20.1 and amplifier 20.2 is coupled to node 65 (the cathode side of laser diode 12.3).

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention In particular, although feedback loop 20 has been described as primarily an electronic loop, it could also be primarily optical; e.g., the optical loop could have a photodetector at its output (where it couples to combiner 20) rather than at its input, the feedback signal portion 12.2 could be optically coupled to an optical amplifier with the output of the amplifier optically coupled to the output photodetector. In this case, the gain adjust and phase adjust elements, if used, would also be well known optical elements.

What is claimed is:

1. An electro-optical subsystem for generating an optical output signal in response to an electrical drive signal providable by a driver circuit to input terminals of said subsystem, comprising a solid state light source for generating said output signal, a negative feedback loop responsive to said optical output signal for generating an electrical feedback signal, said feedback loop and said source being coupled in series with one another across said input terminals, and a combiner for combining said feedback signal with said drive signal, thereby generating a difference signal which is applied to said source, the transmission factor of said feedback loop and the electrical gain of said source being mutually adapted to increase the input impedance of said subsystem.

2. The invention of claim 1 wherein said source comprises a laser.

3. The invention of claim 2 wherein said laser comprises a semiconductor laser.

4. The invention of claim 3 wherein said combiner comprises a differential amplifier having a first input coupled to said drive signal, a second input coupled to said feedback signal, and an output coupled to said laser.

5. The invention of claim 3 wherein said combiner comprises a pair of circuit nodes, with said laser being coupled between said nodes, said drive signal being coupled to one of said nodes, and said feedback signal being coupled to the other of said nodes.

6. The invention of claim 1 wherein said feedback loop comprises a photodetector responsive to said optical output signal for generating said electrical feedback signal and an amplifier for amplifying said feedback signal.

7. The invention of claim 6 wherein said feedback loop further comprises a phase adjuster for altering the phase of said feedback signal.

8. The invention of claim 6 wherein said feedback loop further comprises a gain adjuster for altering the amplitude of said feedback signal.

9. The invention of claim 3 wherein said semiconductor laser comprises a front face and a back face, a first portion of said output signal emanating from said front face and a second portion emanating from said back face.

10. The invention of claim 9 wherein said feedback loop is responsive to said first portion.

11. The invention of claim 9 wherein said feedback loop is responsive to said second portion.

12. The invention of claim 3 wherein the transmission factor of said loop and the electrical gain of said laser are mutually adapted to impedance match the input impedance of said subsystem to the output impedance of said driver.

13. The invention of claim 3 further characterized in that said subsystem comprises a transformer disposed between said input terminals and said combiner to decrease the apparent output impedance of said driver and wherein the transmission factor of said loop and the electrical gain of said laser are mutually adapted to increase the input impedance of said subsystem to a value matching said reduced output impedance of said driver.

14. An electro-optical subsystem which generates an optical output signal in response to an electrical drive signal providable by a driver circuit to input terminals of said subsystem, comprising a laser module including a semiconductor laser for generating said output signal, a negative feedback loop comprising a photodiode responsive to said output signal for generating an electronic feedback signal, an amplifier for amplifying said feedback signal, and a phase adjuster for altering the phase of said feedback signal, said feedback loop and said laser module being coupled in series with one another across said input terminals, a combiner for combining said feedback signal with said drive signal, thereby generating a difference signal which is applied to said laser, the transmission factor of said feedback loop and electronic gain of said laser being mutually adapted to increase the input impedance of said subsystem.

15. The invention of claim 14 further characterized in that a transformer is disposed between said input terminals and said combiner to decrease the apparent output impedance of said circuit and wherein the transmission factor of said loop and the electrical gain of said laser are mutually adapted to increase the input impedance of said subsystem to match said reduced output impedance of said circuit.

16. An optical transmitter comprising an electro-optical subsystem including a solid state light source for generating an optical output signal, a driver circuit for generating an electrical drive signal and for causing said source to emit said output signal, characterized in that said subsystem comprises a negative feedback loop responsive to said optical output signal for generating an electrical feedback signal, said feedback loop and said source being coupled in series with one another across the output of said driver circuit, and a combiner for combining said feedback signal with said drive signal, thereby generating a difference signal which is applied to said source, the transmission factor of said feedback loop and the electrical gain of said source being mutually adapted to increase the input impedance of said subsystem.

17. The invention of claim 16 wherein said source comprises a semiconductor laser.

\* \* \* \* \*